(12) United States Patent
Kim et al.

(10) Patent No.: US 10,553,819 B2
(45) Date of Patent: Feb. 4, 2020

(54) DISPLAY PANEL AND ELECTRONIC DEVICE INCLUDING THE SAME

(71) Applicant: Samsung Display Co., Ltd., Yongin-Si, Gyeonggi-Do (KR)

(72) Inventors: Seunghun Kim, Hwaseong-si (KR); Sooyoun Kim, Siheung-si (KR); Wooyong Sung, Seoul (KR); Seungho Yoon, Hwaseong-si (KR); Moonwon Chang, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/265,761

(22) Filed: Feb. 1, 2019

(65) Prior Publication Data
US 2019/0245159 A1    Aug. 8, 2019

(30) Foreign Application Priority Data
Feb. 2, 2018   (KR) .................. 10-2018-0013611

(51) Int. Cl.
*H01L 51/52* (2006.01)
*H01L 27/32* (2006.01)
*G06F 3/044* (2006.01)

(52) U.S. Cl.
CPC ...... *H01L 51/5246* (2013.01); *H01L 27/3244* (2013.01); *G06F 3/044* (2013.01)

(58) Field of Classification Search
CPC .. H01L 51/5246; H01L 27/3244; G06F 3/044
See application file for complete search history.

(56) References Cited

U.S. PATENT DOCUMENTS

| | | | |
|---|---|---|---|
| 8,456,586 B2 | 6/2013 | Mathew et al. | |
| 9,111,887 B2 | 8/2015 | Kim et al. | |
| 2017/0235398 A1 | 8/2017 | Choi et al. | |
| 2018/0069063 A1 | 3/2018 | Kim et al. | |

FOREIGN PATENT DOCUMENTS

| | | |
|---|---|---|
| KR | 10-1733497 B1 | 5/2017 |
| KR | 10-2017-0096565 A | 8/2017 |
| KR | 10-1801913 B1 | 11/2017 |
| KR | 10-2018-0026599 A | 3/2018 |

*Primary Examiner* — Anthony Ho
(74) *Attorney, Agent, or Firm* — Innovation Counsel LLP

(57) ABSTRACT

A display device may include a base substrate including display and peripheral regions adjacent to each other, an organic light emitting device, and an encapsulation member. A module hole, a first blocking groove, and a second blocking groove may be defined in the base substrate. The module hole may be defined in the display region to penetrate the base substrate from a front surface to a rear surface. The first and second blocking grooves may be provided to enclose the module hole. A distance from the rear surface of the base substrate to a top surface of the encapsulation member between the first and second blocking grooves is smaller than that in a region outside the second blocking groove.

20 Claims, 12 Drawing Sheets

DISPLAY PANEL AND ELECTRONIC DEVICE INCLUDING THE SAME

CROSS-REFERENCE TO RELATED APPLICATIONS

This U.S. non-provisional patent application claims priority under 35 U.S.C. § 119 to Korean Patent Application No. 10-2018-0013611, filed on Feb. 2, 2018, the entire contents of which are hereby incorporated by reference.

BACKGROUND OF THE INVENTION

The present disclosure relates to a display panel and an electronic device including the same, and in particular, to a highly reliable display panel and an electronic device including the same.

Recently, organic light emitting display devices have seen increased interest as display devices. The organic light emitting display device has excellent technical advantages (e.g., low power consumption, high brightness, high response speed, and so forth).

The organic light emitting display device includes an organic light emitting device. The organic light emitting device may be easily damaged by oxygen or moisture. To improve reliability and durability of the organic light emitting display device, the organic light emitting display device is provided to have a structure capable of blocking oxygen or moisture.

SUMMARY

An embodiment of the inventive concept provides a display panel, which is configured to prevent it from being contaminated by an external material, and an electronic device including the same.

According to an embodiment of the inventive concept, a display device may include a base substrate, an organic light emitting device, and an encapsulation member.

In an embodiment, the base substrate may include a front surface and a rear surface, and may include a display region and a peripheral region adjacent to the display region.

In an embodiment, the organic light emitting device may be provided on the display region of the base substrate.

In an embodiment, the encapsulation member may be provided on the organic light emitting device.

In an embodiment, a module hole, a first blocking groove, and a second blocking groove are each defined in the base substrate.

In an embodiment, the module hole may be defined in the display region to penetrate the base substrate from the front surface to the rear surface.

In an embodiment, the first blocking groove may be defined in the display region to enclose the module hole and to have a shape recessed in the front surface of the base substrate.

In an embodiment, the second blocking groove may be defined in the display region to enclose the first blocking groove and to have a shape recessed in the front surface of the base substrate.

In an embodiment, the display device may include a first region between the first blocking groove and the second blocking groove, and a second region outside the second blocking groove.

In an embodiment, a distance from the rear surface of the base substrate to a top surface of the encapsulation member in the first region may be smaller than a distance from the rear surface of the base substrate to the top surface of the encapsulation member in the second region.

In an embodiment, the display device may further include a plurality of insulating layers on the base substrate. The plurality of insulating layers may be provided in the second region, and at least one of the plurality of insulating layers may be not provided in the first region.

In an embodiment, the encapsulation member may include an organic layer.

In an embodiment, the organic layer may be provided in the second region and may be not provided in the first region.

In an embodiment, the display device may further include a third region between the module hole and the first blocking groove. A distance from the rear surface of the base substrate to the top surface of the encapsulation member in the third region may be smaller than a distance from the rear surface of the base substrate to the top surface of the encapsulation member in the second region.

In an embodiment, the encapsulation member may be provided to cover an inner surface of the first blocking groove, an inner surface of the second blocking groove, the first region, and the second region.

In an embodiment, the encapsulation member may include a first inorganic layer, an organic layer on the first inorganic layer, and a second inorganic layer on the organic layer. The first inorganic layer and the second inorganic layer may be spaced apart from each other with the organic layer interposed therebetween in a region overlapped with the organic light emitting device and may be in contact with each other in each of the first blocking groove and the second blocking groove.

In an embodiment, the base substrate may include a first base layer, a first barrier layer, a second base layer, and a second barrier layer.

In an embodiment, the first base layer may include a first organic material and may define the rear surface of the base substrate.

In an embodiment, the first barrier layer may be provided on the first base layer and may include a first inorganic material and define the front surface of the base substrate.

In an embodiment, the second base layer may be provided between the first base layer and the first barrier layer and may include a second organic material.

In an embodiment, the second barrier layer may be provided between the first base layer and the first barrier layer and may include a second inorganic material.

In an embodiment, the module hole may be provided to penetrate the first base layer, the second base layer, the first barrier layer, and the second barrier layer. Each of the first and second blocking grooves may be provided in the first barrier layer and the second base layer.

In an embodiment, each of the first blocking groove and the second blocking groove may include a penetration region, which is provided to penetrate the first barrier layer, and a recessed region, which is defined in the second base layer and is overlapped with the penetration region of the first barrier layer. A width of the recessed region may be larger than a width of the penetration region of the first barrier layer.

In an embodiment, the module hole may have a circular shape, and each of the first blocking groove and the second blocking groove may have a circular ring shape.

In an embodiment, the display device may further include an upper film on the encapsulation member. The upper member may be spaced apart from the encapsulation member in the first region and may be attached to the encapsulation member in the second region.

In an embodiment, the second region may include a first sub-region which is provided in contact with and around the second blocking groove, and a second sub-region which is provided around the first sub-region within the display region.

In an embodiment, a distance from the rear surface of the base substrate to a top surface of the encapsulation member in the first sub-region may be smaller than a distance from the rear surface of the base substrate to the top surface of the encapsulation member in the second sub-region.

According to an embodiment of the inventive concept, an electronic device may include a display panel and an electronic module.

In an embodiment, the display panel may include a plurality of pixels and a base substrate. The base substrate may include a front surface and a rear surface facing each other. The front surface may include a display region, in which the pixels are provided, and a peripheral region, which are provided adjacent to the display region.

In an embodiment, the electronic module may be electrically connected to the display panel.

In an embodiment, the base substrate may include a module hole, a first blocking groove, and a second blocking groove.

In an embodiment, the module hole may be defined in the display region to penetrate the base substrate from the front surface to the rear surface.

In an embodiment, the first blocking groove may be defined in the display region and may have a shape recessed from the front surface of the base substrate.

In an embodiment, the second blocking groove may be defined in the display region and may have a shape recessed from the front surface of the base substrate.

In an embodiment, the electronic module may be contained in the module hole.

In an embodiment, the display panel may include a first region located between the first blocking groove and the second blocking groove, and a second region outside the second blocking groove.

In an embodiment, a thickness of the display panel in the first region may be smaller than a thickness of the display panel in the second region.

In an embodiment, the electronic module includes at least one of a sound output module, a camera module, or a light-receiving module.

According to an embodiment of the inventive concept, a display device may include a base substrate, an organic light emitting device, and an encapsulation member.

In an embodiment, the base substrate may include a display region and a peripheral region adjacent to the display region, and may include a front surface and a rear surface.

In an embodiment, the organic light emitting device may be provided on the display region of the base substrate.

In an embodiment, the encapsulation member may be provided on the organic light emitting device.

In an embodiment, a module hole and a blocking groove are each defined in the base substrate.

In an embodiment, the module hole may be defined in the display region to penetrate the base substrate from the front surface to the rear surface.

In an embodiment, the blocking groove may be defined in the display region and may be provided to enclose the module hole and to have a shape recessed in the front surface of the base substrate.

In an embodiment, the display device may include a first region located between the module hole and the blocking groove, and a second region outside the blocking groove.

In an embodiment, a distance from the rear surface of the base substrate to a top surface of the encapsulation member in the first region may be smaller than a distance from the rear surface of the base substrate to the top surface of the encapsulation member in the second region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown.

Figure 1:
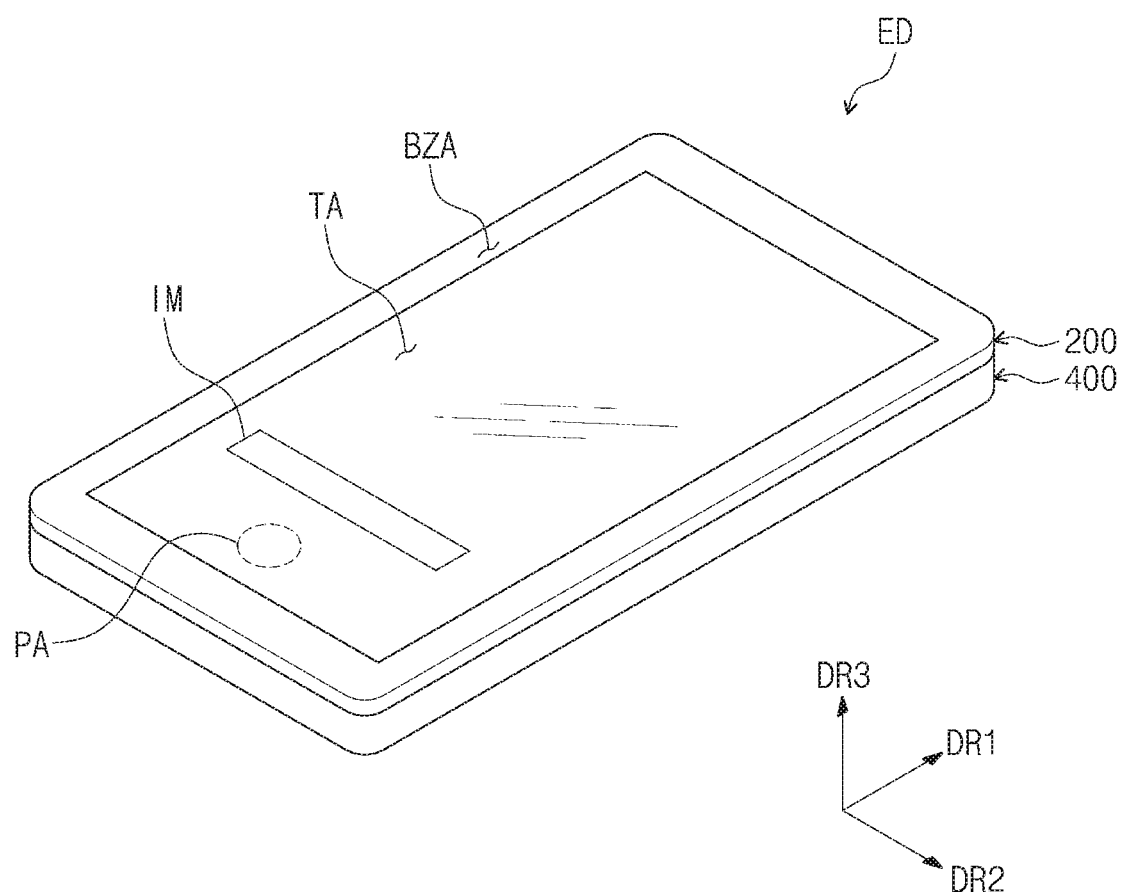
FIG. 1 is a perspective view illustrating an electronic device according to an embodiment of the inventive concept.
Figure 2:
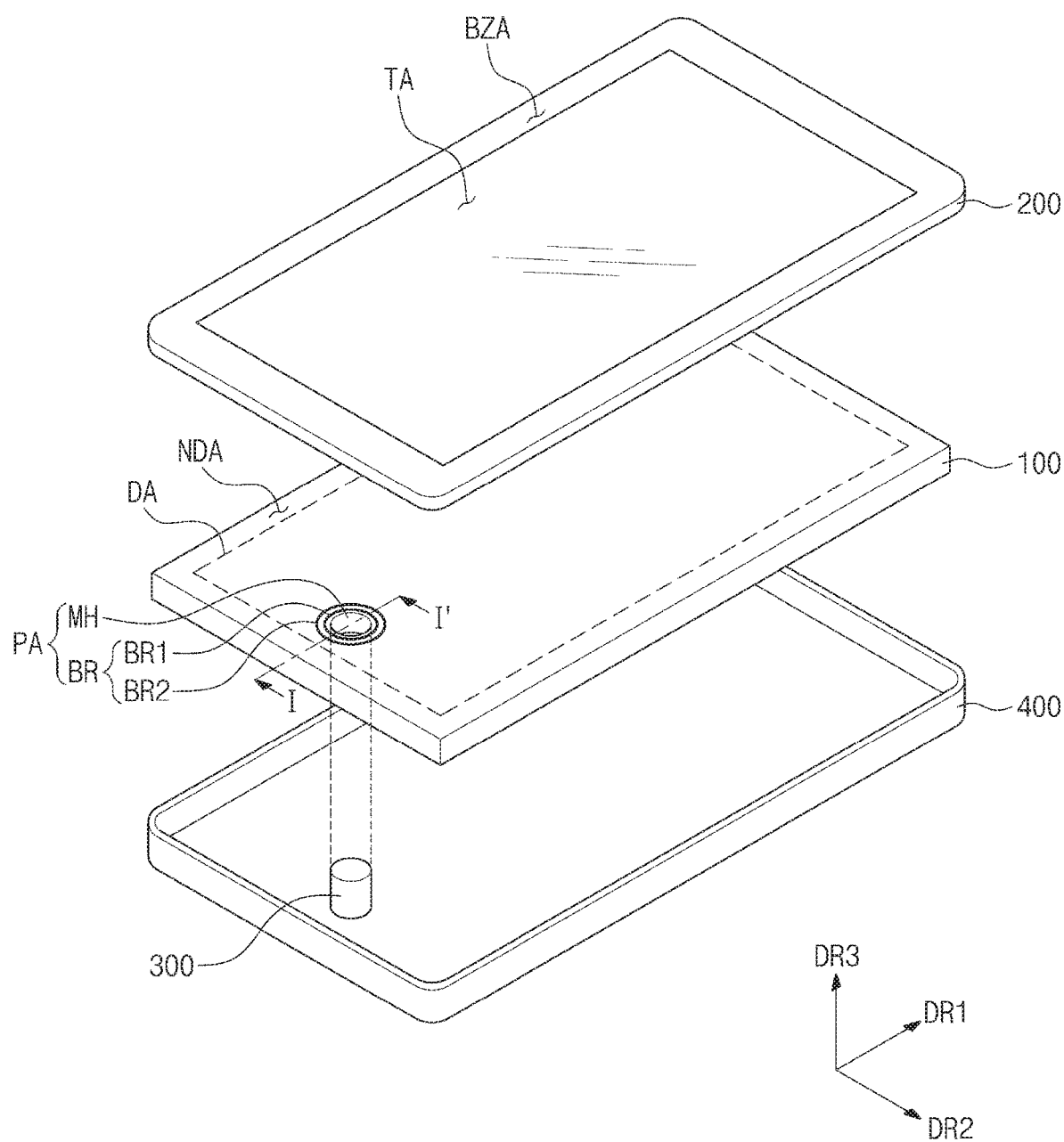
FIG. 2 is an exploded perspective view illustrating the electronic device shown in FIG. 1.
Figure 3:
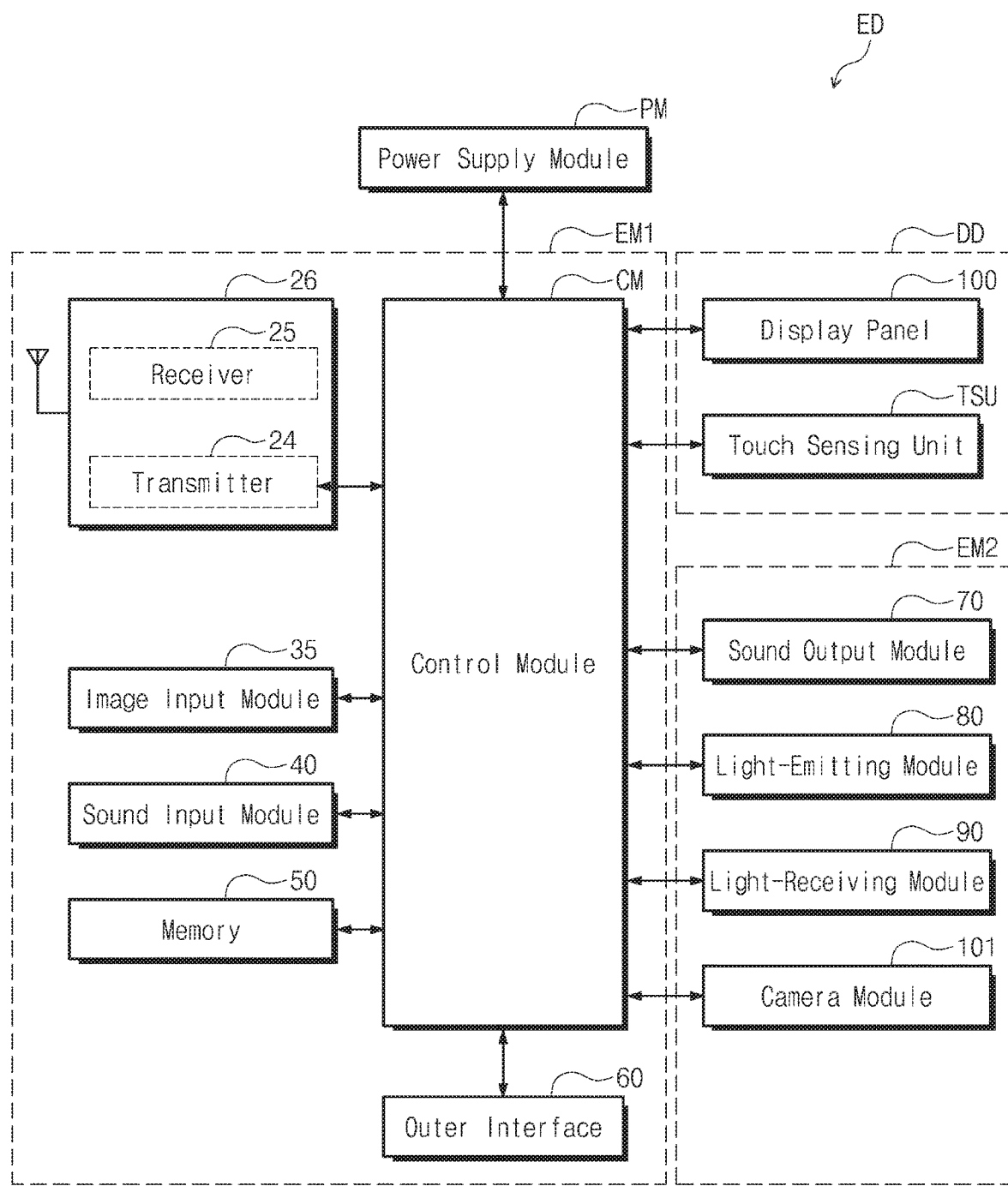
FIG. 3 is a block diagram illustrating the electronic device of FIG. 1.

FIG. 1 is a perspective view illustrating an electronic device according to an embodiment of the inventive concept. FIG. 2 is an exploded perspective view illustrating the electronic device shown in FIG. 1. FIG. 3 is a block diagram illustrating the electronic device of FIG. 1. Hereinafter, an electronic device according to an embodiment of the inventive concept will be described in more detail with reference to FIGS. 1 to 3.

An electronic device ED may be selectively activated by an electrical signal applied thereto. The electronic device ED may be provided in various forms. For example, the electronic device ED may be one of a tablet, notebook, computer, smart television, and so forth. In the present embodiment, the electronic device ED may be a smart phone, as illustrated in FIG. 1.

As shown in FIG. 1, the electronic device ED may include a front surface, which is used to display an image IM and serve as a display surface. The display surface may be defined to be parallel to a first direction DR1 and a second direction DR2. The display surface may include a display region DA and a bezel region BZA adjacent to the display region DA.

The display region DA of the electronic device ED may be used to display the image IM. FIG. 1 illustrates an internet search window as an example of the image IM. The display region DA may have a tetragonal or rectangular shape whose sides are parallel to the first direction DR1 and the second direction DR2. However, the inventive concept is not limited to the above examples, and the shape of the display region DA may be variously changed.

The bezel region BZA may be adjacent to the display region DA. The bezel region BZA may be provided to enclose the display region DA. However, the inventive concept is not limited to this example, and the bezel region BZA may be provided on one of sides of the display region DA or may be omitted. Furthermore, the inventive concept is not limited to a specific structure of the electronic device ED, and the electronic device ED may be provided in various forms.

Hereinafter, a direction that is normal to the display surface will be referred to as a thickness direction of the electronic device ED or a third direction DR3. In the present embodiment, a front or top surface and a rear or bottom surface of each element may be distinguished, based on the third direction DR3. The front and rear surfaces may be opposite to each other in the third direction DR3.

In the present specification, directions indicated by the first to third directions DR1, DR2, and DR3 may be relative concepts, and in certain embodiments, they may be changed to indicate other directions. Hereinafter, first to third directions may be directions indicated by the first to third directions DR1, DR2, and DR3, respectively, and will be referenced with the same numerals.

As shown in FIGS. 1 to 3, the electronic device ED may include a display panel 100, a window member 200, an electronic module 300, and a housing member 400. As shown in FIG. 3, the electronic device ED may further include a display module DD, a first electronic module EM1, a second electronic module EM2, and a power supply module PM. For convenience in illustration, some of elements illustrated in FIG. 3 are omitted from FIG. 2.

The display module DD may include the display panel 100 and a touch sensing unit TSU. The display panel 100 may be configured to generate the image IM. The display panel 100 may also be configured to sense a user input from the outside. In addition, the display panel 100 may be configured to further include a touch sensor, and in this case, the touch sensing unit TSU may be omitted.

The touch sensing unit TSU may be configured to sense a user input from the outside. The user input may include various types of external inputs, such as a part of a user's body, light, heat, or pressure. In order to reduce complexity in the drawings, the touch sensing unit TSU may not be illustrated in FIG. 2.

In the present embodiment, the display panel 100 may include the display region DA and a peripheral region NDA. As described above, the display region DA may be used to generate and display the image IM. For example, a plurality of pixels, which are used to generate light constituting the image IM, may be provided in the display region DA. This will be described in more detail below.

The peripheral region NDA may be adjacent to the display region DA. The peripheral region NDA may be provided to enclose the display region DA. A driving circuit or a driver line for driving the display region DA may be provided in the peripheral region NDA.

Although not shown, a portion of the peripheral region NDA of the display panel 100 may be curved or bent. For example, a portion of the peripheral region NDA may be provided to face the front surface of the electronic device ED, and another portion of the peripheral region NDA may be provided to face a rear surface of the electronic device ED. Alternatively, in an embodiment of the inventive concept, the display panel 100 may be configured not to have the peripheral region NDA.

In an embodiment, the display panel 100 may include a module structure PA provided on the display region DA. The module structure PA may be configured to define a space for the electronic module 300. The module structure PA may include a module hole MH and a blocking groove BR.

The module hole MH may be provided to penetrate the display panel 100. The module hole MH may have a cylindrical shape extending in the third direction DR3. The module hole MH may be used to contain the electronic module 300. In an embodiment, since the display panel 100 includes the module hole MH, it may be possible to realize a thin display device.

The blocking groove BR may be placed adjacent to and/or around the module hole MH. The blocking groove BR may be formed to have a shape recessed in a front surface of the display panel 100. When viewed in a plan view, the blocking groove BR may be provided to have a closed loop shape enclosing the module hole MH. In the present embodiment, the blocking groove BR may have a circular ring shape enclosing the module hole MH. The blocking groove BR may include a first blocking groove BR1 and a second blocking groove BR2. The module hole MH and the blocking groove BR will be described in more detail below.

The window member 200 may be provided to define the front surface of the electronic device ED. The window member 200 may be provided on the front surface of the display panel 100 and may be used to protect the display panel 100. For example, the window member 200 may include a glass substrate, a sapphire substrate, or a plastic film. The window member 200 may have a single- or multi-layered structure. For example, the window member 200 may have a stacking structure, including a plurality of plastic films which are coupled to each other by an adhesive layer, or including a glass substrate and a plastic film which are coupled to each other by an adhesive layer.

The window member 200 may include a transmission region TA and a bezel region BZA. The transmission region TA may be a region of the window member 200 corresponding to the display region DA. For example, the transmission region TA may be overlapped with the front surface of the display region DA. The image IM, which is displayed on the display region DA of the display panel 100, may be provided to a user through the transmission region TA.

The bezel region BZA may be used to define a shape of the transmission region TA. The bezel region BZA may be provided adjacent to the transmission region TA to enclose the transmission region TA. The bezel region BZA may have a predetermined color. The bezel region BZA may be provided to cover the peripheral region NDA of the display panel 100 and thereby to prevent the peripheral region NDA from being seen by a user. However, the inventive concept is not limited to the above example, and in an embodiment, the bezel region BZA may be omitted from the window member 200.

The power supply module PM may be configured to supply an electric power to the electronic device ED. The power supply module PM may include a typical battery module.

The housing member 400 may be coupled to the window member 200. The housing member 400 may be provided to define the rear surface of the electronic device ED. The housing member 400 may be coupled to the window member 200 to define an internal space, which is used to contain the display panel 100, the electronic module 300, and various elements shown in FIG. 3. The housing member 400 may include a material having a relatively high strength. For example, the housing member 400 may include a plurality of frames and/or plates, each of which is formed of at least one of glass, plastic, or metallic materials. The housing member 400 may be used to stably protect the elements of the electronic device ED, which are contained in the internal space, from an external impact.

The electronic module 300 may include various functional modules, which are used to operate the electronic device ED. The electronic module 300 may include the first electronic module EM1 and the second electronic module EM2.

The first electronic module EM1 may be directly mounted on a motherboard, which is electrically connected to the display module DD. Alternatively, the first electronic module EM1 may be mounted on another substrate and may be electrically connected to the motherboard through a connector (not shown).

The first electronic module EM1 may include a control module CM, a wireless communication module 26, an image input module 35, a sound input module 40, a memory 50, and an outer interface 60. At least one of the modules may not be mounted on the motherboard and may be electrically connected to the motherboard through a flexible circuit board.

The control module CM may be configured to control overall operations of the electronic device ED. The control module CM may be, for example, a microprocessor. In an embodiment, the display module DD may be activated or inactivated under the control of the control module CM. The control module CM may control other modules, such as the image input module 35 or the sound input module 40, based on touch signals received from the display module DD.

The wireless communication module 26 may be configured to transmit and receive a wireless signal to and from another terminal via a Bluetooth or a Wi-Fi line. The wireless communication module 26 may be configured to transmit and receive a voice signal via a typical communication line. The wireless communication module 26 may include a transmitter 24, which is configured to modulate and transmit a signal to be transmitted, and a receiver 25, which is configured to demodulate the received signal.

The image input module 35 may be configured to process an image signal and to convert the image signal into image data that can be displayed on the display module DD. The sound input module 40 may be configured to receive an external sound signal through a microphone in a recording mode or in a voice recognition mode and then to convert the sound signal into electrical voice data.

The outer interface 60 may be configured to serve as an interface that is connected to an external charger, a wired/wireless data port, a card socket (e.g., a memory card or a SIM/UIM card), and so forth.

The second electronic module EM2 may include a sound output module 70, a light-emitting module 80, a light-receiving module 90, and a camera module 101. The modules of the second electronic module EM2 may be directly mounted on a motherboard. Alternatively, the modules of the second electronic module EM2 may be mounted on another substrate and may be electrically connected to the display module DD or the first electronic module EM1 through a connector (not shown).

The sound output module 70 may be configured to convert sound data, which is transmitted from the wireless communication module 26 or is stored in the memory 50, and to output the converted sound data outside the electronic device ED.

The light-emitting module 80 may be configured to generate and output light. In an embodiment, the light-emitting module 80 may be configured to emit infrared light. The light-emitting module 80 may include a light-emitting diode (LED) device. The light-receiving module 90 may be configured to sense the infrared light. The light-receiving module 90 may be activated when the infrared light incident thereto has an intensity higher than a reference value. The light-receiving module 90 may be or include a complementary metal-oxide semiconductor (CMOS) image sensor. The infrared light emitted from the light-emitting module 80 may be reflected by an external object (e.g., a user's finger or face) and may be received by the light-receiving module 90. The camera module 101 may be used to obtain an image of an external object.

The electronic module 300 of FIG. 2 may constitute or may be one of the elements constituting the second electronic module EM2. Here, although not shown, the first electronic module EM1 and the remaining elements of the second electronic module EM2 may be placed at other positions. However, the inventive concept is not limited to these examples, and in an embodiment, the electronic module 300 may be one of the modules constituting the first and second electronic modules EM1 and EM2.

Figure 4:
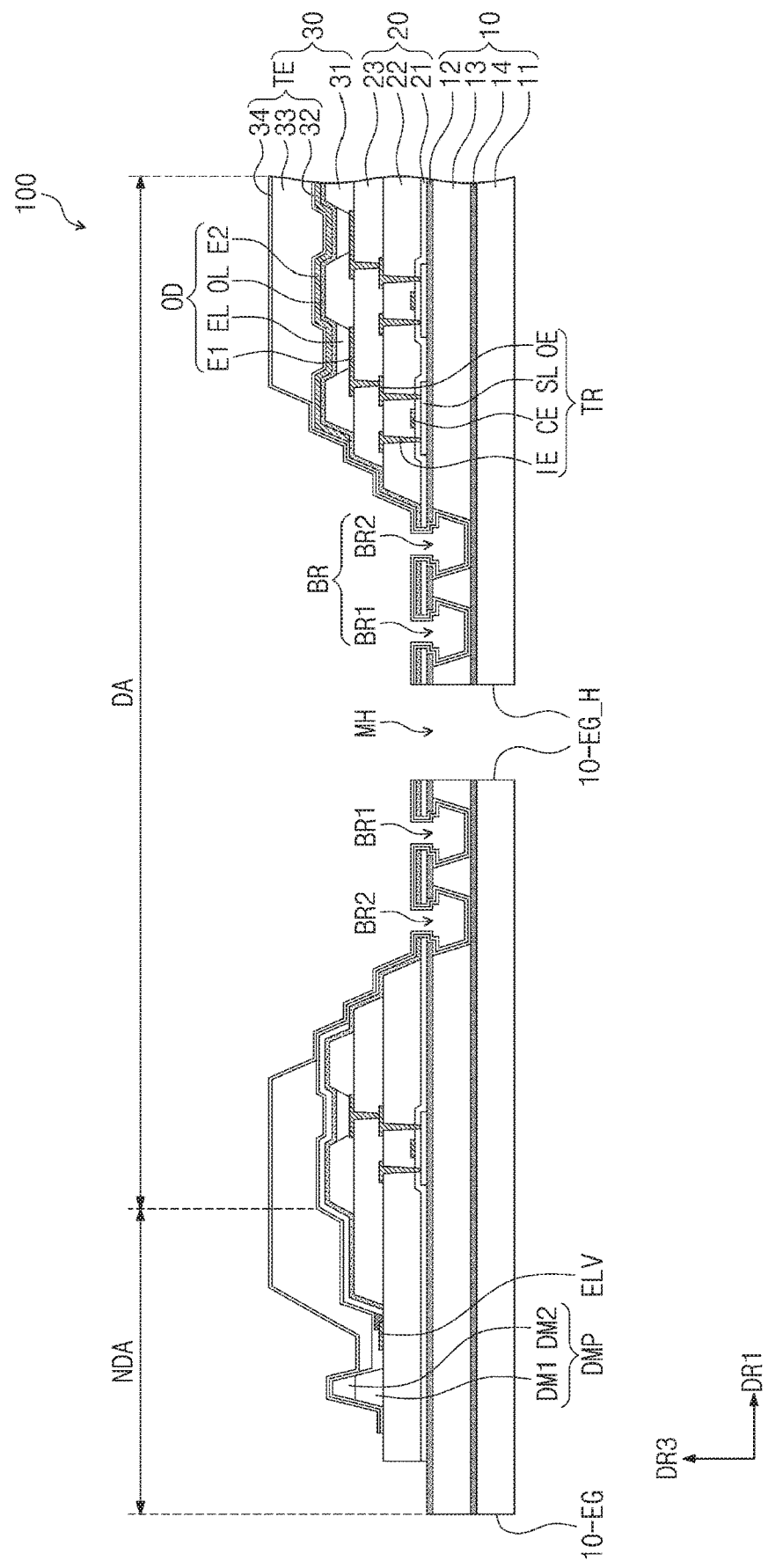
FIG. 4 is a sectional view taken along line I-I' of FIG. 2.
Figure 5:
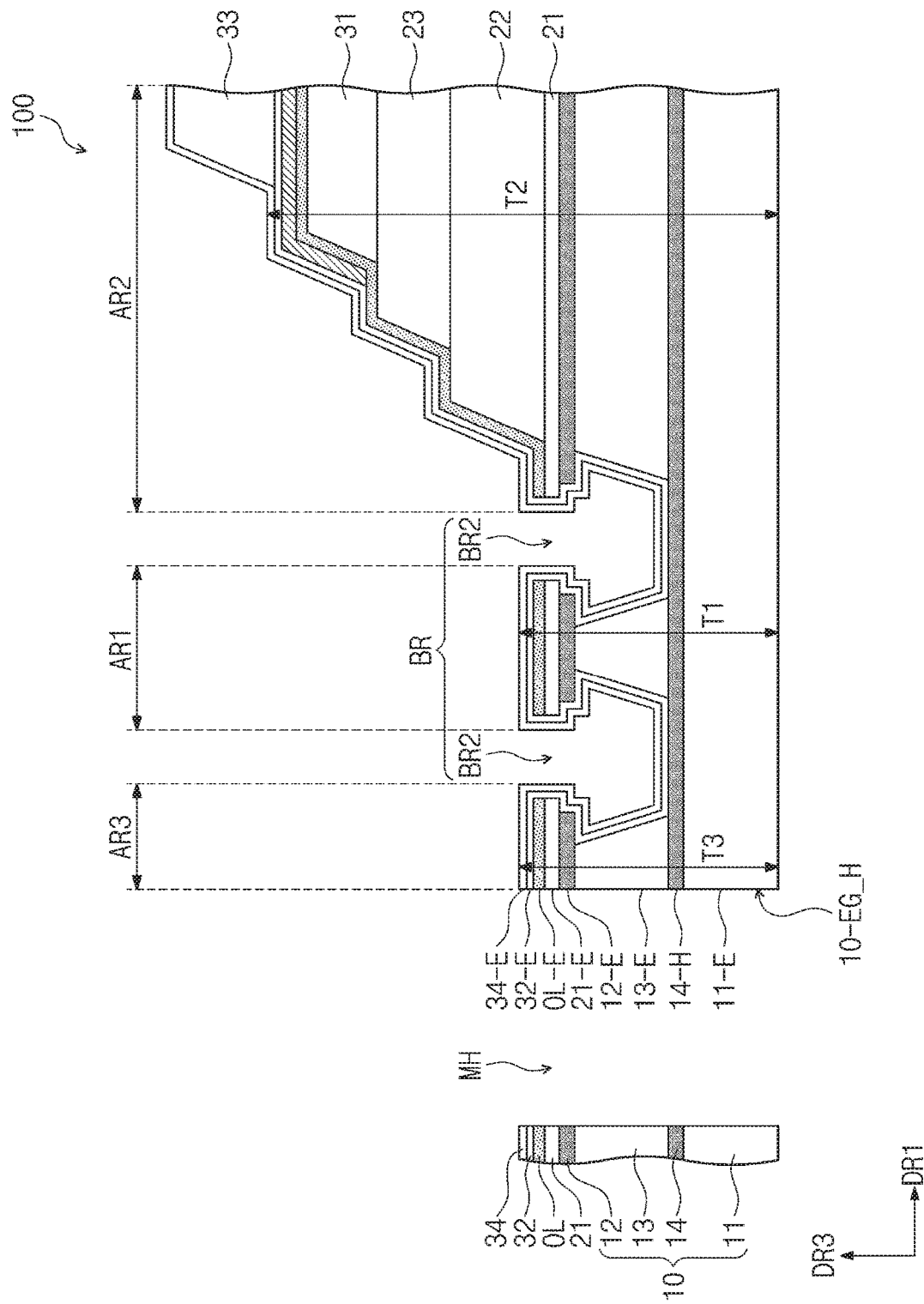
FIG. 5 is an enlarged sectional view illustrating a portion of the electronic device shown in FIG. 4.
Figure 6:
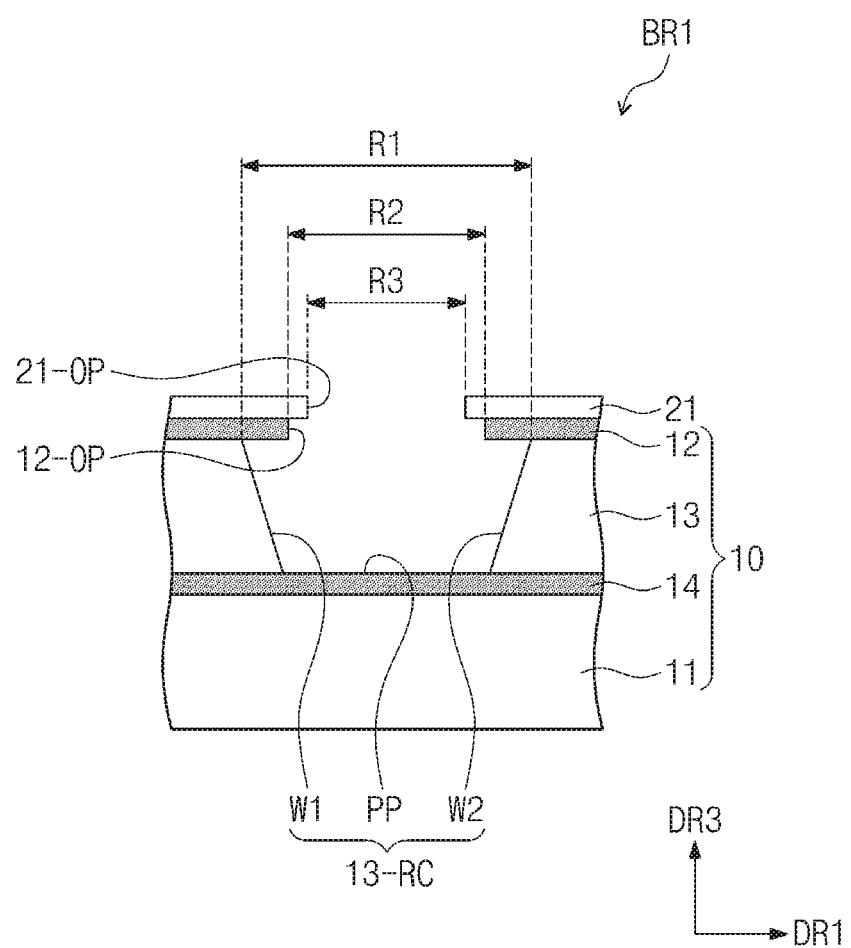
FIG. 6 is an enlarged sectional view illustrating a portion of the electronic device shown in FIG. 5.

FIG. 4 is a sectional view taken along line I-I' of FIG. 2. FIG. 5 is an enlarged sectional view illustrating a portion of the electronic device shown in FIG. 4. FIG. 6 is an enlarged sectional view illustrating a portion of the electronic device shown in FIG. 5. Hereinafter, the display panel 100 according to an embodiment of the inventive concept will be described with reference to FIGS. 4 to 6.

As shown in FIG. 4, the display panel 100 may include a base substrate 10, a thin-film device layer 20, and a display device layer 30. The base substrate 10, the thin-film device layer 20, and the display device layer 30 may be stacked in the third direction DR3.

The base substrate 10 may include a first base layer 11, a first barrier layer 12, a second base layer 13, and a second barrier layer 14.

The first base layer 11 may be used as a lower or bottom layer of the base substrate 10. A rear surface of the first base layer 11 may serve as a rear surface of the base substrate 10.

The first base layer 11 may be an insulating layer containing an organic material. The first base layer 11 may include a flexible plastic material. For example, the first base layer 11 may be formed of or include at least one of polyimide (PI), polyethylene naphthalate (PEN), polyethylene terephthalate (PET), polyarylate, polycarbonate (PC), polyetherimide (PEI), or polyethersulfone (PES).

The first barrier layer 12 may include an inorganic material. The first barrier layer 12 may be used as an upper or top layer of the base substrate 10. A front surface of the first barrier layer 12 may serve as a front surface of the base substrate 10.

The first barrier layer 12 may be an insulating layer containing an inorganic material. For example, the first barrier layer 12 may be formed of or include at least one of silicon oxide, silicon nitride, or amorphous silicon.

The second base layer 13 and the second barrier layer 14 may be provided between the first base layer 11 and the first barrier layer 12. The second base layer 13 may be formed of or include the same material as the first base layer 11. The second barrier layer 14 may be formed of or include the same material as the first barrier layer 12.

The first base layer 11, the second base layer 13, the first barrier layer 12, and the second barrier layer 14 may be alternately disposed. For example, the first barrier layer 12 and the second barrier layer 14 may be provided on the second base layer 13 and the first base layer 11, respectively. Each of the first and second barrier layers 12 and 14 may be configured to prevent external moisture or oxygen from infiltrating the thin-film device layer 20 through the first and second base layers 11 and 13.

The thin-film device layer 20 may be provided on the base substrate 10. The thin-film device layer 20 may include a plurality of insulating layers and a thin-film transistor TR. Each of the insulating layers may include an inorganic material and/or an organic material. The insulating layers may include first to third insulating layers 21, 22, and 23.

The thin-film transistor TR may include a semiconductor pattern SL, a control electrode CE, an input electrode IE, and an output electrode OE. The thin-film transistor TR may be configured to control current flow of electric charges passing through the semiconductor pattern SL, based on signals applied to the control electrode CE, or to selectively output electrical signals, which are input from the input electrode IE, through the output electrode OE.

The first insulating layer 21 may be provided between the semiconductor pattern SL and the control electrode CE. In the present embodiment, the control electrode CE may be provided on the semiconductor pattern SL, as shown in FIG. 4. However, the inventive concept is not limited to these examples, and in an embodiment, the thin-film transistor TR may be configured to include the semiconductor pattern SL provided on the control electrode CE.

The second insulating layer 22 may be provided between the control electrode CE and the input and output electrodes IE and OE. The input electrode IE and the output electrode OE may be provided on the second insulating layer 22. The input electrode IE and the output electrode OE may be provided to penetrate the first and second insulating layers 21 and 22 and may be coupled to two opposite portions of the semiconductor pattern SL, respectively. However, the inventive concept is not limited to these examples, and in an embodiment, the input and output electrodes IE and OE may be directly coupled to the semiconductor pattern SL.

The third insulating layer 23 may be provided on the second insulating layer 22. The third insulating layer 23 may cover the thin-film transistor TR. The third insulating layer 23 may be used to prevent electrically connection of the thin-film transistor TR with the display device layer 30.

The display device layer 30 may include an organic light emitting device OD and a plurality of insulating layers. The insulating layers may include a fourth insulating layer 31 and an encapsulation member TE.

The fourth insulating layer 31 may be provided on the third insulating layer 23. A plurality of openings may be defined in the fourth insulating layer 31. The organic light emitting device OD may be provided in each of the openings.

The organic light emitting device OD may include a first electrode E1, a second electrode E2, a light emitting layer EL, and a charge control layer OL. The first electrode E1 may be provided on the thin-film device layer 20. The first electrode E1 may be provided to penetrate the third insulating layer 23 and may be electrically coupled to the thin-film transistor TR. In an embodiment, a plurality of the first electrodes E1 may be provided. Each of the first electrodes E1 may be partially exposed by a corresponding one of openings.

The second electrode E2 may be provided on the first electrode E1. In an embodiment, the second electrode E2 may be a single pattern, which is overlapped with a plurality of the first electrodes E1 and the fourth insulating layer 31. In the case where a plurality of the organic light emitting devices OD are provided, the same voltage may be applied to the second electrode E2 for a plurality of the organic light emitting devices ED. In this case, the second electrode E2 may be formed without an additional patterning process. However, the inventive concept is not limited to these examples, and in an embodiment, a plurality of the second electrodes E2 may be provided on the openings, respectively.

The light emitting layer EL may be provided between the first and second electrodes E1 and E2. In an embodiment, a plurality of the light emitting layers EL may be provided in the openings, respectively. In the organic light emitting device OD, the light emitting layer EL may be activated, depending on a potential difference between the first and second electrodes E1 and E2, thereby emitting light.

The charge control layer OL may be provided between the first and second electrodes E1 and E2. The charge control layer OL may be provided adjacent to the light emitting layer EL. In the present embodiment, the charge control layer OL may be provided between the light emitting layer EL and the second electrode E2, as illustrated in FIG. 4. However, the inventive concept is not limited thereto, and the charge control layer OL may be provided between the light emitting layer EL and the first electrode E1 or may include a plurality of layers, which are stacked in the third direction DR3 with the light emitting layer EL interposed therebetween.

The charge control layer OL may be formed without an additional patterning process, and thus, the charge control layer OL may be a single pattern that is overlapped with the front surface of the base substrate 10. The charge control layer OL may be provided on other regions, and may not be provided for the openings formed in the fourth insulating layer 31.

The encapsulation member TE may be provided on the organic light emitting device OD. The encapsulation member TE may include an inorganic layer and/or an organic layer. In the present embodiment, the encapsulation member TE may include a first inorganic layer 32, an organic layer 33, and a second inorganic layer 34.

Each of the first and second inorganic layers 32 and 34 may be formed of or include an inorganic material. For example, each of the first and second inorganic layers 32 and 34 may be formed of or include at least one of aluminum oxide, silicon oxide, silicon nitride, silicon oxynitride, silicon carbide, titanium oxide, zirconium oxide, or zinc oxide. The first inorganic layer 32 and the second inorganic layer 34 may be formed of or include the same material or different materials.

The organic layer 33 may be provided between the first and second inorganic layers 32 and 34. The organic layer 33 may be formed of or include an organic material. For example, the organic layer 33 may include at least one of epoxy, polyimide (PI), polyethylene terephthalate (PET), polycarbonate (PC), polyethylene (PE), or polyacrylate.

Each of the first and second inorganic layers 32 and 34 may be a single pattern that is formed to cover substantially the entire top surface of the display panel 100. Each of the first and second inorganic layers 32 and 34 may be partially overlapped with the organic layer 33. For example, the first and second inorganic layers 32 and 34 may be spaced apart from each other in the third direction DR3 with the organic layer 33 interposed therebetween in a region and may be in direct contact with in the third direction DR3 in another region.

The display panel 100 may further include a dam portion DMP. The dam portion DMP may extend along and/or adjacent to an edge region of the display region DA (e.g., see FIG. 2). The dam portion DMP may be provided to enclose the display region DA.

The dam portion DMP may include a first dam DM1 and a second dam DM2. The first dam DM1 may be formed of or include the same material as the third insulating layer 23. The first dam DM1 may be formed using a process of forming the third insulating layer 23 and may be provided on the same layer as the third insulating layer 23.

The second dam DM2 may be stacked on the first dam DM1. The second dam DM2 may be formed of or include the same material as the fourth insulating layer 31. The second dam DM2 may be formed using a process of forming the fourth insulating layer 31 and may be formed on the same layer as the fourth insulating layer 31. However, the inventive concept is not limited to these examples, and in an embodiment, the dam portion DMP may be provided to have a single-layered structure.

In an embodiment, a liquid organic material may be supplied to form the organic layer 33, and here, the dam portion DMP may be used to delimit a spread boundary of the liquid organic material to be spread over the base substrate 10. For example, the organic layer 33 may be formed by coating the liquid organic material onto the first inorganic layer 32 using an inkjet method, and here, the dam portion DMP may prevent the liquid organic material from being overflown to the outside of the dam portion DMP, thereby delimiting the spread boundary of the liquid organic material.

Hereinafter, a region, in which the module hole MH and the blocking groove BR are defined, will be described in more detail with reference to FIGS. 5 and 6. For convenience in illustration, the first and second inorganic layers 32 and 34 are omitted from FIG. 6. The module hole MH may be provided to pass through the display panel 100 in the third direction DR3. In an embodiment, the module hole MH may be defined in the display region DA to penetrate not only the base substrate 10 but also at least one of the layers constituting the display region DA.

For example, the module hole MH may be provided to penetrate the base substrate 10. An inner surface 10-EG_H of the module hole MH may be defined by the ends of a plurality of layers. For example, the module hole MH may be provided to penetrate the first base layer 11, the first barrier layer 12, the second base layer 13, and the second barrier layer 14, thereby defining ends 11-E, 12-E, 13-E, and 14-E, which are respective ends of the first base layer 11, the first barrier layer 12, the second base layer 13, and the second barrier layer 14, and together define a portion a lower portion of the inner surface 10-EG_H.

In addition, the module hole MH may be provided to penetrate at least one of the layers constituting the display region DA. For example, the module hole MH may be provided to penetrate the first insulating layer 21, the charge control layer OL, the first inorganic layer 32, and the second inorganic layer 34. Accordingly, the first insulating layer 21, the charge control layer OL, the first inorganic layer 32, and the second inorganic layer 34 may have respective ends 21-E, OL-E, 32-E, and 34-E, which define an upper portion of the inner surface 10-EG_H.

In the present embodiment, the module hole MH may be formed in such a way that the ends 11-E, 12-E, 13-E, 14-E, 21-E, OL-E, 32-E, and 34-E are aligned to each other in the third direction DR3. Thus, the module hole MH may have a circular cylindrical shape extending in the third direction DR3 (e.g., having a height in the third direction DR3). However, the inventive concept is not limited to these examples, and in an embodiment, the end of at least one of the layers defining the module hole MH may not be aligned to the ends of the others.

The blocking groove BR may include the first blocking groove BR1 and the second blocking groove BR2. When viewed in a plan view, the first blocking groove BR1 may be provided to enclose the module hole MH, and the second blocking groove BR2 may be provided to enclose the first blocking groove BR1. The module hole MH, the first blocking groove BR1, and the second blocking groove BR2 may be spaced apart from each other. In an embodiment, the blocking groove BR may further include at least one blocking groove, which is spaced apart from the second blocking groove BR2 and encloses the second blocking groove BR2.

The first blocking groove BR1 and the second blocking groove BR2 may be provided to have substantially the same sectional shape, and thus, for the sake of simplicity, the shape of the first blocking groove BR1 will be described in detail below, without repeating an overlapping description of the shape of the second blocking groove BR2.

The first blocking groove BR1 may be an empty region, which is recessed from the front surface of the base substrate 10 in the third direction DR3. For example, the first blocking groove BR1 may be provided to penetrate the front surface of the base substrate 10, not the rear surface.

The first blocking groove BR1 may be formed by removing at least a portion of the base substrate 10. For example, the first blocking groove BR1 may be formed by removing at least a portion of the first barrier layer 12 and the second base layer 13. In an embodiment, the first blocking groove BR1 may be formed to penetrate both of the first barrier layer 12 and the second base layer 13 in the third direction DR3, as shown in FIG. 5, but the inventive concept is not limited thereto. For example, at least a portion of the second base layer 13 may remain under the first blocking groove BR1. The first blocking groove BR1 may be formed not to penetrate the first base layer 11 and the second barrier layer 14. In this case, the second barrier layer 14 may prevent oxygen or moisture, which is supplied through the first base layer 11 from the outside, from entering the first blocking groove BR1.

In an embodiment, the first blocking groove BR1 may include an inner surface defining an undercut shape in the base substrate 10. The first blocking groove BR1 may include a recessed region 13-RC and at least one penetration region. In the present embodiment, the first blocking groove BR1 may include a penetration region 12-OP, which is formed to penetrate the first barrier layer 12.

The recessed region 13-RC may be defined in the second base layer 13. The recessed region 13-RC may be an empty region (i.e., does not include within it any material element of the electronic device ED), which is recessed from a front surface of the second base layer 13. The recessed region 13-RC may include a flat surface PP, a first side surface W1, and a second side surface W2. For convenience in illustration, the first side surface W1 and the second side surface W2 are illustrated as different surfaces, but the first side surface W1 and the second side surface W2 may be connected to each other to constitute a single surface.

The flat surface PP may be a surface that is recessed away from a front surface of the second base layer 13 toward a rear surface. In an embodiment, the flat surface PP may be spaced apart from the front surface of the second base layer 13 in the third direction DR3. In an embodiment, the flat surface PP may be a portion of a top surface of the second barrier layer 14. Each of the first side surface W1 and the second side surface W2 may be connected to the flat surface PP. Each of the first side surface W1 and the second side surface W2 may be inclined at an angle to the flat surface PP. In the recessed region 13-RC, each of the first side surface W1 and the second side surface W2 may be inclined at an angle of 90° or larger to the flat surface PP.

The penetration region 12-OP of the first barrier layer 12 and the recessed region 13-RC may be formed to define an undercut shape. For example, the first barrier layer 12 may be overlapped with the recessed region 13-RC of the second base layer 13. The first barrier layer 12 may protrude inwardly from the recessed region 13-RC to cover at least a portion of the recessed region 13-RC. When measured in the first direction DR1, a width R2 of the penetration region 12-OP of the first barrier layer 12 may be smaller than a width R1 of the recessed region 13-RC.

When measured in the first direction DR1, the width of the recessed region 13-RC at a top level of the second base layer 13 may be larger than that at a bottom level of the second base layer 13. The recessed region 13-RC may have a truncated cone shape. However, the inventive concept is not limited thereto, and the recessed region 13-RC may have a truncated pyramid shape or a truncated elliptic cone shape.

Each of the first and second inorganic layers 32 and 34 may be extended to a region where the first and second blocking grooves BR1 and BR2 are provided. For example, the first and second inorganic layers 32 and 34 may be provided to cover a region adjacent to the first and second blocking grooves BR1 and BR2 and inner surfaces of the first and second blocking grooves BR1 and BR2. In an embodiment, the first and second inorganic layers 32 and 34 may be provided to conformally cover the inner surfaces of the first and second blocking grooves BR1 and BR2.

In an embodiment, the charge control layer OL may have an end, which is cut at a region adjacent to the first and second blocking grooves BR1 and BR2, and may not be overlapped with the blocking groove BR. The cut end of the charge control layer OL adjacent to the blocking groove BR may be covered with the first and second inorganic layers 32 and 34.

As shown in FIGS. 4 and 5, each of the base substrate 10, the thin-film device layer 20, and the display device layer 30 may have ends that are cut at a region adjacent to the module hole MH. The cut ends may be exposed through the module hole MH. Oxygen or moisture from the outside of the display panel 100 may infiltrate into the base substrate 10, the thin-film device layer 20, and the display device layer 30 through the exposed ends.

In an embodiment, since the first and second blocking grooves BR1 and BR2 are defined at a region adjacent to the module hole MH, it may be possible to block an infiltration path of oxygen or moisture, which is entered from the module hole MH. For example, the first blocking groove BR1 may be used to block oxygen or moisture, which is entered through the module hole MH, and the second blocking groove BR2 may be used to block a fraction of the oxygen or moisture passing through the first blocking groove BR1. In detail, the first blocking groove BR1 may be provided to separate a portion of the charge control layer OL, which is located between the module hole MH and the first blocking groove BR, from another portion located outside the first blocking groove BR1. Accordingly, even if there is oxygen or moisture to be supplied through the module hole MH, such oxygen or moisture may not be entered into a portion located outside the first blocking groove BR1, and thus, it may be possible to prevent the thin-film device layer 20 or the display device layer 30, which is located outside the first blocking groove BR1, from being damaged. Since the second blocking groove BR2 has substantially the same structure as the first blocking groove BR1, the second blocking groove BR2 may be used for the same purpose.

Furthermore, in an embodiment, the first and second inorganic layers 32 and 34 may cover portions that are located between the module hole MH and the first blocking groove BR1, between the first and second blocking grooves BR1 and BR2, in the first and second blocking grooves BR1 and BR2, and outside the second blocking groove BR2. The organic layer (e.g., the charge control layer OL), which is cut at a region adjacent to the first and second blocking grooves BR1 and BR2, may be covered with the first and second inorganic layers 32 and 34. Accordingly, it may be possible to more effectively prevent oxygen or moisture from entering into an internal region of the display panel 100.

Figure 7:
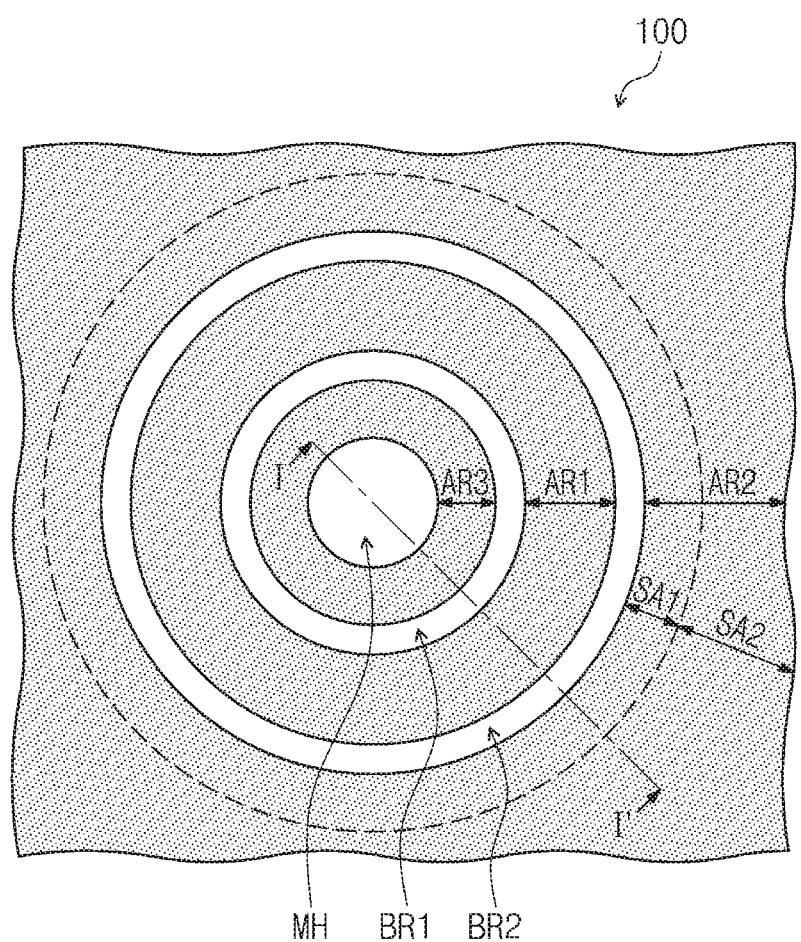
FIG. 7 is a plan view illustrating a module hole, a first blocking groove, a second blocking groove, and a neighboring region, which are provided in a display panel according to an embodiment of the inventive concept.

FIG. 7 is a plan view illustrating the module hole MH, the first blocking groove BR1, the second blocking groove BR2, and a neighboring region, which are provided in a display panel according to an embodiment of the inventive concept.

Referring to FIGS. 5 to 7, in the display panel 100, a region between the first and second blocking grooves BR1 and BR2 may be defined as a first region AR1, and a region outside the second blocking groove BR2 may be defined as a second region AR2, and a region between the module hole MH and the first blocking groove BR1 may be defined as a third region AR3. The first region AR1, the second region AR2, and the third region AR3 may be regions that are located within the display region DA.

In an embodiment, at least one of the first to fourth insulating layers and the organic layer 21, 22, 23, 31, and 33 may not be provided in the first region AR1. FIGS. 4 and 5 illustrate an example, in which the first insulating layer 21 in provided in the first region AR1 and the second to fourth insulating layers and the organic layer 22, 23, 31, and 33 are not provided in the first region AR1.

The first to fourth insulating layers and the organic layer 21, 22, 23, 31, and 33 may be provided in the second region AR2.

Thus, a first distance T1 between the top surface of the second inorganic layer 34 and the bottom surface of the first base layer 11 in the first region AR1 may be smaller than a second distance T2 between the top surface of the second inorganic layer 34 and the bottom surface of the first base layer 11 in the second region AR2. That is, in an embodiment, in the display panel 100 provided with the encapsulation member TE, a thickness of the first region AR1 of the display panel 100 may be smaller than a thickness of the second region AR2 of the display panel 100.

In addition, at least one of the first to fourth insulating layers and the organic layer 21, 22, 23, 31, and 33 may not be provided in the third region AR3. Thus, a third distance T3 between the top surface of the second inorganic layer 34 and the bottom surface of the first base layer 11 in the third region AR3 may be smaller than the second distance T2 between the top surface of the second inorganic layer 34 and the bottom surface of the first base layer 11 in the second region AR2. A layer structure of the third region AR3 of the display panel 100 may be substantially the same as that of the first region AR1. FIGS. 4 and 5 illustrate an example in which all of the first to fourth insulating layers and the organic layer 21, 22, 23, 31, and 33 are not provided in the third region AR3.

Figure 8:
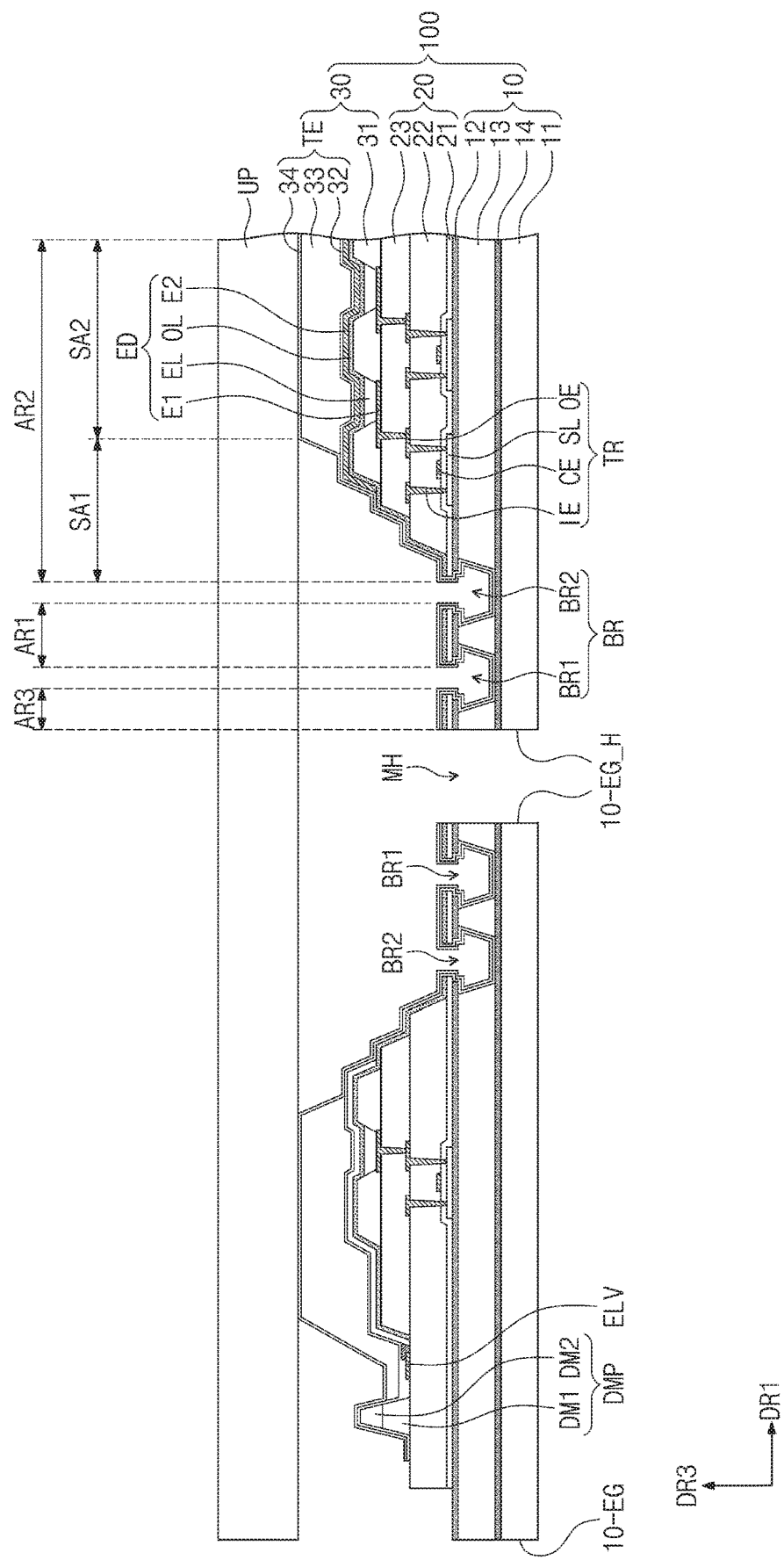
FIG. 8 is a sectional view illustrating a display panel and an upper film, which are prepared to perform a subsequent process, in an embodiment of the inventive concept.

FIG. 8 is a sectional view illustrating a display panel and an upper film, which are prepared to perform a subsequent process, in an embodiment of the inventive concept. For convenience in illustration, FIG. 8 illustrates a region corresponding to the region shown in FIG. 4.

An upper film UP may be attached to an upper portion of the display panel 100. The upper film UP may be attached to the encapsulation member TE. To do this, an adhesive layer may be provided between the upper film UP and the encapsulation member TE. The upper film UP may be used to protect a portion of the display panel 100 located below the upper film UP.

The upper film UP may be used to protect elements, which are located below the upper film UP, before a subsequent process (e.g., a module assembling process), and may be an element that is not provided in a final product. Thus, the upper film UP may be removed before the subsequent process.

Since the upper film UP is attached to the encapsulation member TE, the removal of the upper film UP may lead to a partial removal of the second inorganic layer 34, which is the topmost layer of the encapsulation member TE, or may lead to a cracking issue.

In the case where a thickness of the display panel 100 in the first region AR1 is equal or similar to that in the second region AR2, the upper film UP may be in contact with the second inorganic layer 34 in not only the second region AR2 but also the first region AR1. In this case, when the upper film UP is removed, a portion of the second inorganic layer 34 in the first region AR1 may be removed. In this case, it may be difficult to use the second blocking groove BR2 for the purpose of preventing oxygen or moisture from the outside, and thus, the thin-film device layer 20 or the display device layer 30 may be damaged.

In the case where a thickness of the display panel 100 in the third region AR3 is equal or similar to a thickness of the display panel 100 in the second region AR2, the above problem may occur in a similar manner.

According to an embodiment of the inventive concept, since at least one of the first to fourth insulating layers and the organic layer 21, 22, 23, 31, and 33 is removed in advance from the first and third regions AR1 and AR3, a thickness or height of the display panel 100 in the first and third regions AR1 and AR3 may be smaller than that in the second region AR2. Thus, when the upper film UP is attached to the display panel 100, the upper film UP may be attached to the second inorganic layer 34 in the second region AR2, but not to the second inorganic layer 34 in the first and third regions AR1 and AR3. Thus, when the upper film UP is removed in a subsequent process, it may be possible to prevent a portion of the second inorganic layer 34 in the first and third regions AR1 and AR3 from being unintentionally removed, and thus, the first and second blocking grooves BR1 and BR2 may be used to effectively block oxygen or moisture from the outside.

In the display panel 100 of FIGS. 7 and 8, the second region AR2 may include a first sub-region SA1 and a second sub-region SA2. The first sub-region SA1 may be a region, which is located in contact with and around the second blocking groove BR2 or is located outside the second sub-region SA2.

In the first sub-region SA1, at least one of the first to fourth insulating layers and the organic layer 21, 22, 23, 31, and 33 may have an inclined side surface. Accordingly, a distance from the bottom surface of the first base layer 11 to the second inorganic layer 34 in the first sub-region SA1 may be smaller than a distance from the bottom surface of the first base layer 11 to the second inorganic layer 34 in the second sub-region SA2. In the first sub-region SA1, the second inorganic layer 34 may not be in contact with the upper film UP, and in the second sub-region SA2, the second inorganic layer 34 may be in contact with the upper film UP.

According to an embodiment of the inventive concept, when the upper film UP is removed from the display panel 100, the second inorganic layer 34 in the first sub-region SA1 may be used to prevent the second inorganic layer 34 in the second sub-region SA2 from being delaminated and thereby to prevent the second inorganic layer 34 in the second sub-region SA2 from being damaged. That is, in the display panel 100 according to an embodiment of the inventive concept, it may be possible to prevent the second inorganic layer 34 from being damaged, unlike the comparative example in which the second inorganic layer 34 is attached to the upper film UP in the entire area of the second region AR2.

Figure 9:
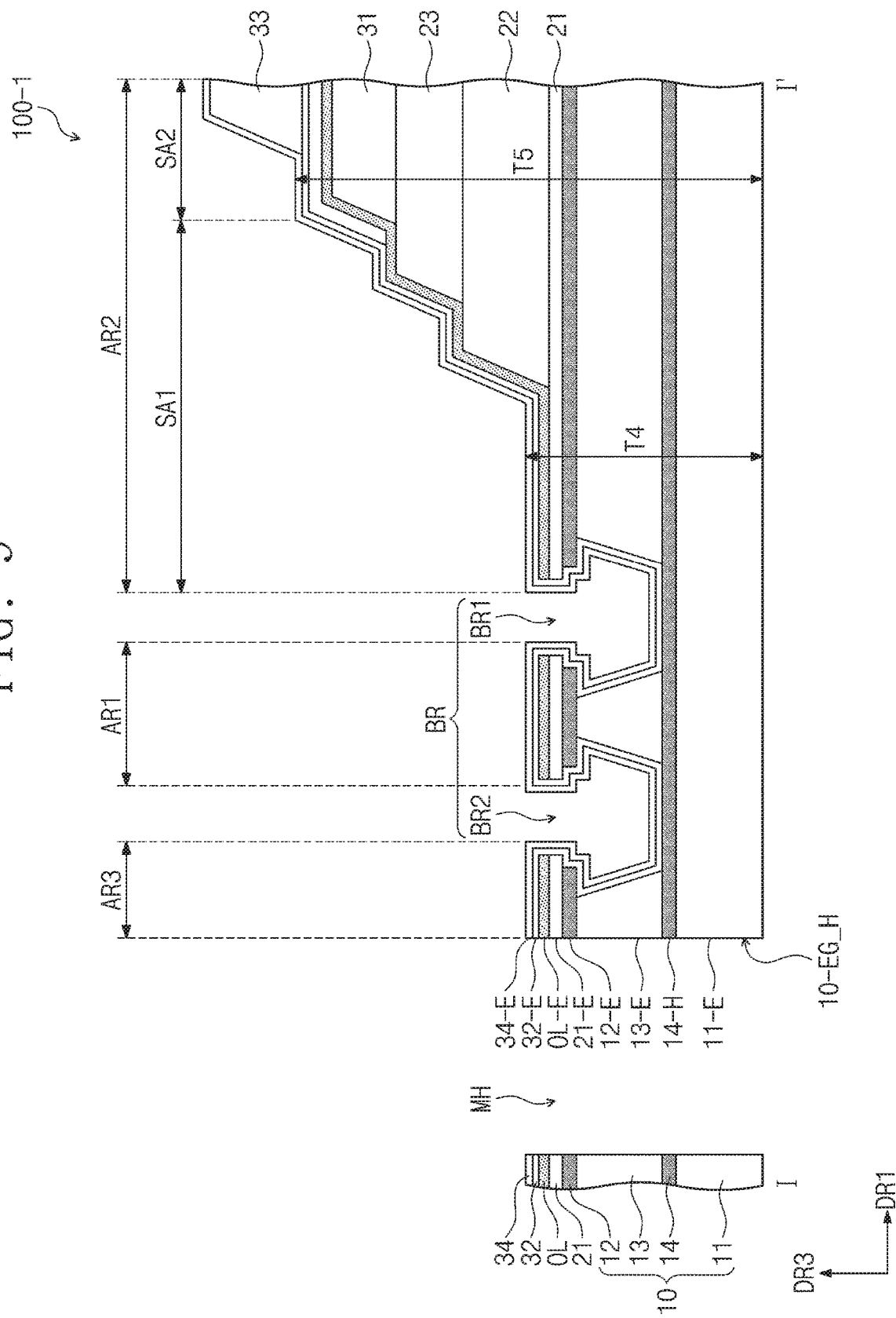
FIG. 9 is a sectional view, which is taken along line I-I' of FIG. 7 to illustrate a display device according to an embodiment of the inventive concept.

FIG. 9 is a sectional view, which is taken along line I-I' of FIG. 7 to illustrate a display device according to an embodiment of the inventive concept.

In an embodiment, at least one of the first to fourth insulating layers and the organic layer 21, 22, 23, 31, and 33 may not be provided in the first sub-region SA1. FIG. 9 illustrates an example, in which all of the first to fourth insulating layers and the organic layer 21, 22, 23, 31, and 33 are not provided, or are only partially provided, in the first sub-region SA1.

The first to fourth insulating layers and the organic layer 21, 22, 23, 31, and 33 may be provided in the second sub-region SA2.

Thus, in a portion of the first sub-region SA1, a fourth distance T4 from the top surface of the second inorganic layer 34 to the bottom surface of the first base layer 11 may be smaller than a fifth distance T5 from one top surface of the second inorganic layer 34 at a portion of second sub-region SA2 to the bottom surface of the first base layer 11 in the second sub-region SA2.

In an embodiment of FIG. 9, it may be possible to prevent an unintended removal or crack of the second inorganic layer 34 in the first sub-region SA1, when the upper film UP of FIG. 8 is attached to an upper portion of a display panel 100-1 and then is removed, and thus, the thin-film device layer 20 and the display device layer 30 may be prevented from being damaged.

Figure 10A:
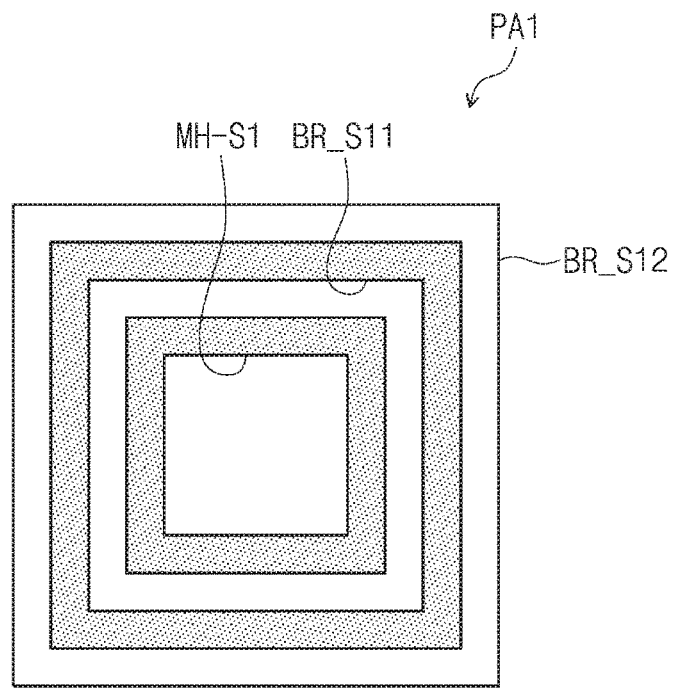
FIGS. 10A, 10B and 10C are plan views, each of which illustrates a portion of a display panel according to an embodiment of the inventive concept.
Figure 10B:
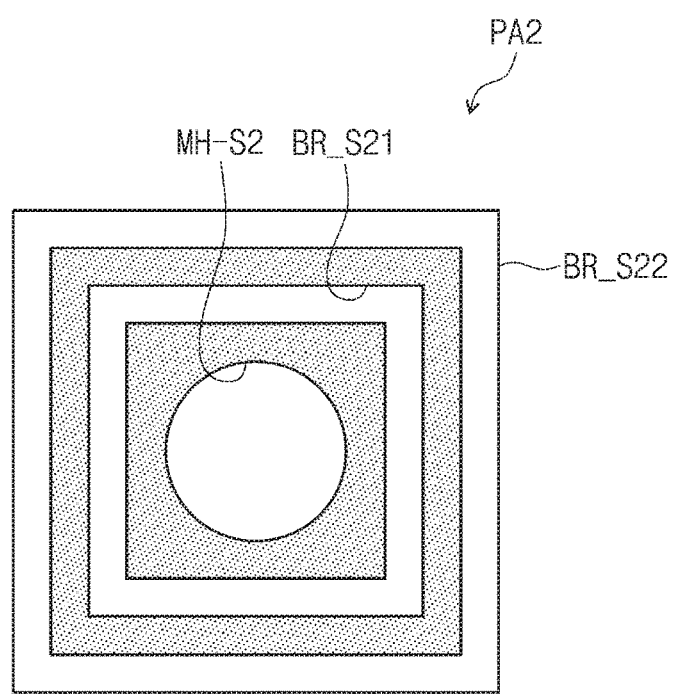
Figure 10C:
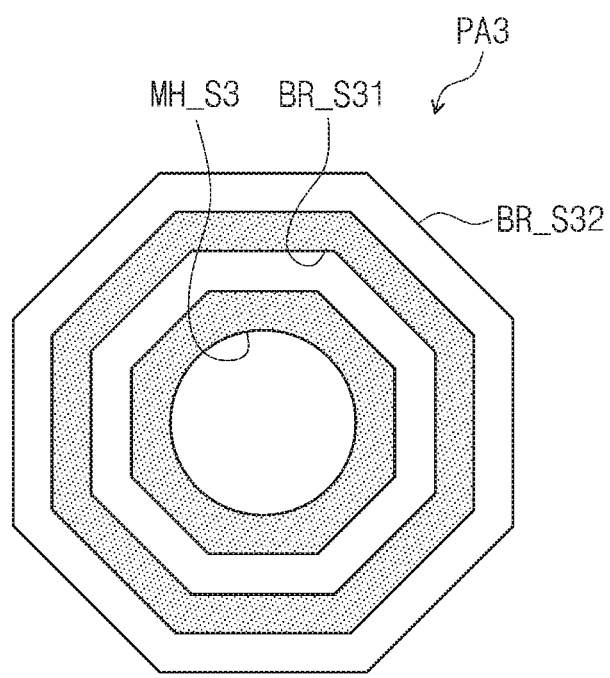

FIGS. 10A to 10C are plan views, each of which illustrates a portion of a display panel according to an embodiment of the inventive concept. In detail, planar shapes of module structures PA1, PA2, and PA3 are illustrated in FIGS. 10A to 10C, respectively. The module structures PA1, PA2, and PA3 will be described in more detail with reference to FIGS. 10A to 10C.

As shown in FIG. 10A, the module structure PA1 may include a module hole MH-S1, a first blocking groove BR_S11, and a second blocking groove BR_S12. The module hole MH-S1 may have a polygonal shape, when viewed in a plan view. In the present embodiment, the module hole MH-S1 is illustrated to have a tetragonal shape. That is, the module hole MH-S1 may be provided to have a tetragonal or polygonal pillar shape.

The first blocking groove BR_S11 may be formed along and/or surrounding an edge of the module hole MH-S1. The first blocking groove BR_S11 may have a shape corresponding to that of the module hole MH-S1. For example, the first blocking groove BR_S11 may have a tetragonal ring shape surrounding the module hole MH-S1, when viewed in a plan view.

The second blocking groove BR_S12 may be formed along and/or surrounding an edge of the first blocking groove BR_S11. The second blocking groove BR_S12 may have a shape corresponding to that of the first blocking groove BR_S11. For example, the second blocking groove BR_S12 may have a tetragonal ring shape surrounding the first blocking groove BR_S11, when viewed in a plan view.

Alternatively, as shown in FIG. 10B, the module structure PA2 may include a module hole MH_S2 and first and second blocking grooves BR_S21 and BR_S22, which have different shapes from the module hole MH_S2. When viewed in a plan view, the module hole MH_S2 may have a circular shape, as shown in FIG. 10B. For example, the module hole MH_S2 may have substantially the same shape as the module hole MH of FIG. 7.

The first blocking groove BR_S21 may have a shape different from the module hole MH_S2, when viewed in a plan view. In the present embodiment, the first blocking groove BR_S21 may have a rectangular or tetragonal shape, as shown in FIG. 10B.

The second blocking groove BR_S22 may have a shape that is different from the module hole MH_S2 and corresponds to the first blocking groove BR_S21. In the present embodiment, the second blocking groove BR_S22 may have a rectangular or tetragonal shape, as shown in FIG. 10B.

If the first blocking groove BR_S21 and the second blocking groove BR_S22 are placed adjacent to the module hole MH_S2, the shape of each of the first blocking groove BR_S21 and the second blocking groove BR_S22 may not be limited to the shape corresponding to the module hole MH_S2 and may be variously changed.

As shown in FIG. 10C, the module structure PA3 may include a module hole MH_S3 and first and second blocking grooves BR_S31 and BR_S32, which have different shapes from the module hole MH_S3. In the present embodiment, when viewed in a plan view, each of the first blocking groove BR_S31 and the second blocking groove BR_S32 may have an octagonal shape, as shown in FIG. 10C. The more the shape of the first blocking groove BR_S31 is similar to that of the module hole MH_S3, the smaller an area of a region between the first blocking groove BR_S31 and the module hole MH_S3. Thus, an area occupied by the module structure PA3 in the display region DA (e.g., see FIG. 2) may be reduced, and this may make it possible to reduce influence of the module structure PA3 on the display region DA.

Figure 11:
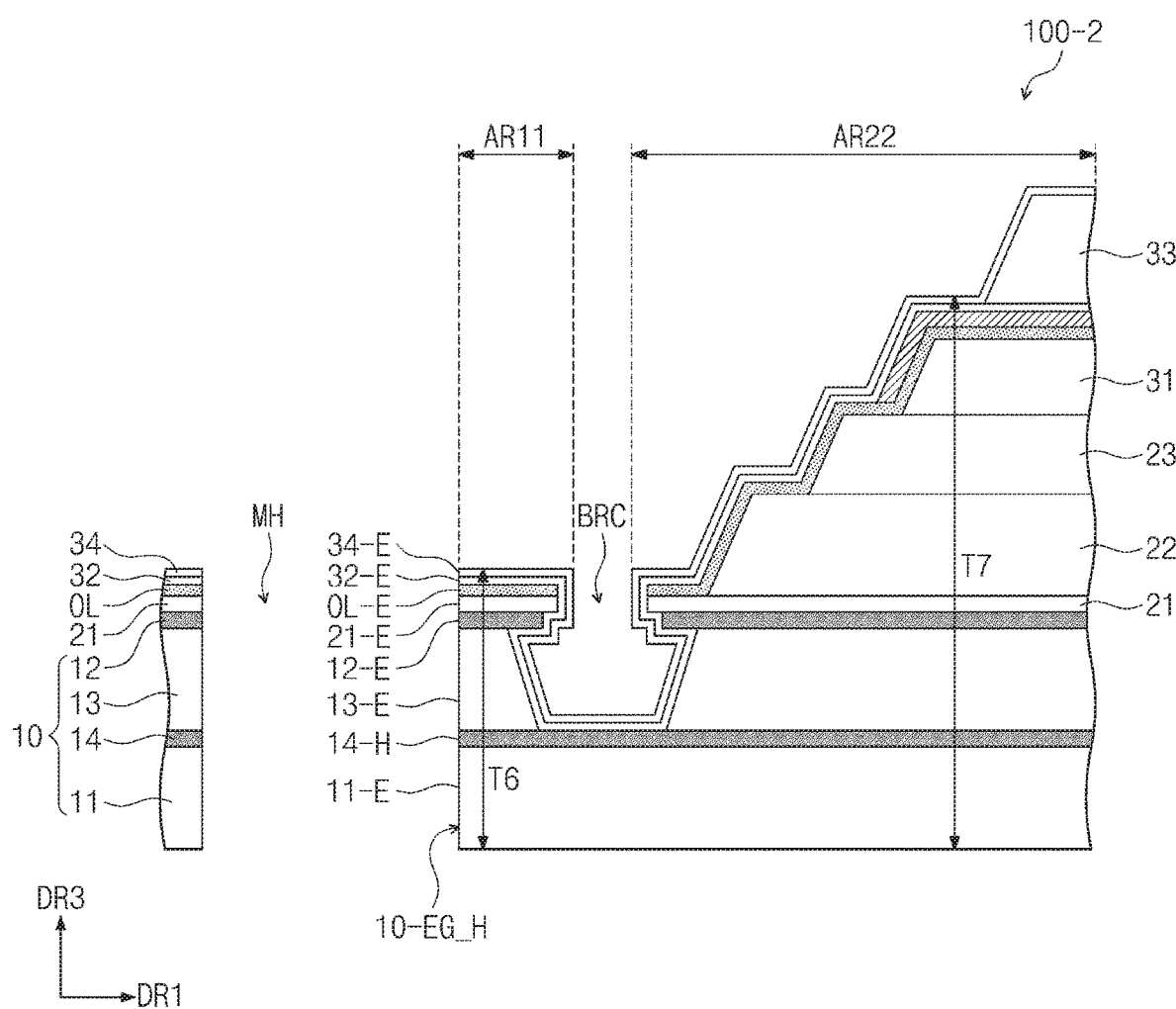
FIG. 11 is an enlarged sectional view illustrating a portion of a display panel according to an embodiment of the inventive concept.

FIG. 11 is an enlarged sectional view illustrating a portion of a display panel according to an embodiment of the inventive concept.

In a display panel 100-2 according to an embodiment of the inventive concept, at least one of the first and second blocking grooves BR1 and BR2 may be removed, and except for this difference, the display panel 100-2 may be configured to have substantially the same features as those of the display panel 100 of FIGS. 4 and 5.

The module hole MH and a blocking groove BRC may be provided in the base substrate 10 of the display panel 100-2. The module hole MH and the blocking groove BRC may have substantially the same shape as the module hole MH and one of the first and second blocking grooves BR1 and BR2 described with reference to FIGS. 4 to 6, and thus, for concise description, a detailed description thereof will be omitted.

A region between the module hole MH and the blocking groove BRC may be defined as a first region AR11, and a region outside the blocking groove BRC may be defined as a second region AR22.

A sixth distance T6 from the top surface of the second inorganic layer 34 to the bottom surface of the first base layer 11 in the first region AR11 may be smaller than a seventh distance T7 from a top surface of the second inorganic layer 34 at a portion of the second region AR22 to the bottom surface of the first base layer 11 in the second region AR22. That is, in the display panel 100 provided with the encapsulation member TE, a thickness of the first region AR11 of the display panel 100 may be smaller than a thickness of at least a portion of the second region AR22 of the display panel 100.

According to an embodiment of the inventive concept, at least one of the first to fourth insulating layers and the organic layer 21, 22, 23, 31, and 33 may be removed in advance from the first region AR11. Thus, even if the upper film UP is attached to the display panel 100-2 and then is removed, it may be possible to prevent a portion of the second inorganic layer 34 in the first region AR11 from being unintentionally removed, and thus, the blocking groove BRC may be used to effectively block oxygen or moisture from the outside.

According to an embodiment of the inventive concept, it may be possible to effectively prevent a device from being damaged by oxygen or moisture to be supplied from the outside of the device. This may make it possible to realize an electronic device with high fabricating or operational reliability.

Furthermore, even in the case that an upper film is attached to a display panel and then is removed from the display panel, it may be possible to prevent a portion of an upper inorganic layer, which constitutes the display panel, from being removed from a region between blocking grooves, and thereby to effectively block oxygen or moisture from the outside.

While example embodiments of the inventive concept have been particularly shown and described, it will be understood by one of ordinary skill in the art that variations in form and detail may be made therein without departing from the spirit and scope of the attached claims.

What is claimed is:

1. A display device, comprising:
    a base substrate including a front surface and a rear surface, a display region and a peripheral region adjacent to the display region being defined in the base substrate;
    an organic light emitting device in the display region of the base substrate; and
    an encapsulation member on the organic light emitting device,
    wherein a module hole, a first blocking groove, and a second blocking groove are each defined in the base substrate,
    the module hole is defined in the display region to penetrate the base substrate from the front surface to the rear surface,
    the first blocking groove is defined to enclose the module hole and to have a shape recessed in the front surface of the base substrate,
    the second blocking groove is defined to enclose the first blocking groove and to have a shape recessed in the front surface of the base substrate,
    the display region includes a first region between the first and second blocking groove, and a second region outside the second blocking groove, and
    a distance from the rear surface of the base substrate to a top surface of the encapsulation member in the first region is smaller than a distance from the rear surface of the base substrate to the top surface of the encapsulation member in the second region.

2. The display device of claim 1, further comprising a plurality of insulating layers on the base substrate,
    wherein the plurality of insulating layers are provided in the second region, and
    at least one of the plurality of insulating layers is not provided in the first region.

3. The display device of claim 1, wherein the encapsulation member comprises an organic layer, and
    the organic layer is provided in the second region and is not provided in the first region.

4. The display device of claim 1, wherein the display region includes a third region between the module hole and the first blocking groove, and
    a distance from the rear surface of the base substrate to the top surface of the encapsulation member in the third region is smaller than a distance from the rear surface of the base substrate to the top surface of the encapsulation member in the second region.

5. The display device of claim 1, wherein the encapsulation member is provided to cover an inner surface of the first blocking groove, an inner surface of the second blocking groove, the first region, and the second region.

6. The display device of claim 5, wherein the encapsulation member comprises a first inorganic layer, an organic layer on the first inorganic layer, and a second inorganic layer on the organic layer, and
    the first inorganic layer and the second inorganic layer are spaced apart from each other with the organic layer interposed therebetween in a region overlapped with the organic light emitting device, and are in contact with each other in each of the first blocking groove and the second blocking groove.

7. The display device of claim 1, wherein the base substrate comprises:
    a first base layer comprising a first organic material and defining the rear surface of the base substrate;
    a first barrier layer on the first base layer, the first barrier layer comprising a first inorganic material and defining the front surface of the base substrate;
    a second base layer provided between the first base layer and the first barrier layer, the second base layer comprising a second organic material; and
    a second barrier layer provided between the first base layer and the first barrier layer, the second barrier layer comprising a second inorganic material.

8. The display device of claim 7, wherein the module hole is provided to penetrate the first base layer, the second base layer, the first barrier layer, and the second barrier layer, and
    each of the first and second blocking grooves is provided in the first barrier layer and the second base layer.

9. The display device of claim 7, wherein each of the first blocking groove and the second blocking groove comprises a penetration region, which is provided to penetrate the first barrier layer, and a recessed region, which is defined in the second base layer and is overlapped with the penetration region of the first barrier layer, and
    a width of the recessed region is larger than a width of the penetration region of the first barrier layer.

10. The display device of claim 1, wherein the module hole has a circular shape, and each of the first blocking groove and the second blocking groove has a circular ring shape.

11. The display device of claim 1, further comprising an upper film on the encapsulation member,
    wherein the upper member is spaced apart from the encapsulation member in the first region and is attached to the encapsulation member in the second region.

12. The display device of claim 1, wherein the second region includes a first sub-region which is provided in contact with and around the second blocking groove, and a second sub-region which is provided around the first sub-region within the display region, and
    a distance from the rear surface of the base substrate to a top surface of the encapsulation member in the first sub-region is smaller than a distance from the rear surface of the base substrate to the top surface of the encapsulation member in the second sub-region.

13. An electronic device, comprising:
    a display panel including a plurality of pixels and a base substrate, the base substrate including a front surface and a rear surface facing each other, a display region in which the pixels are provided, and a peripheral region which is provided adjacent to the display region being defined in the front surface; and
    an electronic module electrically connected to the display panel,
    wherein the base substrate comprises:
        a module hole which is defined in the display region to penetrate the base substrate from the front surface to the rear surface;
        a first blocking groove which is defined in the display region and has a shape recessed from the front surface of the base substrate; and
        a second blocking groove which is defined in the display region and has a shape recessed from the front surface of the base substrate,
    the electronic module is contained in the module hole,
    a display region includes a first region located between the first blocking groove and the second blocking groove, and a second region located outside the second blocking groove, and a thickness of the display panel in the first region is smaller than a thickness of the display panel in the second region.

14. The electronic device of claim 13, wherein the electronic module comprises at least one of a sound output module, a camera module, or a light-receiving module.

15. The electronic device of claim 13, wherein the first blocking groove has a closed loop shape enclosing the module hole and the second blocking groove has a closed loop shape enclosing the first blocking groove.

16. The electronic device of claim 13, wherein the display panel further comprises a plurality of insulating layers provided on the base substrate,
the plurality of insulating layers are provided in the second region, and
at least one of the plurality of insulating layers is not provided in the first region.

17. The electronic device of claim 13, wherein each of the first blocking groove and the second blocking groove comprises a penetration region, which is provided to penetrate the first barrier layer, and a recessed region, which is defined in the second base layer and is overlapped with the penetration region of the first barrier layer, and
a width of the recessed region is larger than a width of the penetration region of the first barrier layer.

18. A display device, comprising:
a base substrate including a front surface and a rear surface, a display region and a peripheral region adjacent to the display region are defined in the base substrate, when viewed in a plan view;
an organic light emitting device on the display region of the base substrate; and
an encapsulation member on the organic light emitting device,
wherein a module hole and a blocking groove are each defined in the base substrate,
the module hole is defined in the display region to penetrate the base substrate from the front surface to the rear surface,
the blocking groove is defined in the display region and is provided to enclose the module hole and has a shape recessed in the front surface of the base substrate,
the display region includes a first region between the module hole and the blocking groove, and a second region outside the blocking groove, and
a distance from the rear surface of the base substrate to a top surface of the encapsulation member in the first region is smaller than a distance from the rear surface of the base substrate to the top surface of the encapsulation member in the second region.

19. The display device of claim 18, further comprising a plurality of insulating layers on the base substrate,
wherein the plurality of insulating layers are provided in the second region, and
at least one of the plurality of insulating layers is not provided in the first region.

20. The display device of claim 18, wherein the encapsulation member is provided to cover an inner surface of the blocking groove, the first region, and the second region.

* * * * *